(12) United States Patent
Zhu

(10) Patent No.: US 11,158,824 B2
(45) Date of Patent: Oct. 26, 2021

(54) DISPLAY COMPONENT, DISPLAY, MANUFACTURING METHODS AND ELECTRONIC DEVICE

(71) Applicant: BEIJING XIAOMI MOBILE SOFTWARE CO., LTD., Beijing (CN)

(72) Inventor: Xun Zhu, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/791,805

(22) Filed: Feb. 14, 2020

(65) Prior Publication Data

US 2021/0135133 A1 May 6, 2021

(30) Foreign Application Priority Data

Oct. 30, 2019 (CN) .......................... 201911042966.0

(51) Int. Cl.
*H01L 51/00* (2006.01)
*G09G 3/3225* (2016.01)
*H01L 27/32* (2006.01)
*H01L 51/52* (2006.01)
*H01L 51/56* (2006.01)

(52) U.S. Cl.
CPC ....... *H01L 51/0097* (2013.01); *G09G 3/3225* (2013.01); *H01L 27/3276* (2013.01); *H01L 51/5253* (2013.01); *H01L 51/56* (2013.01); *G09G 2380/02* (2013.01); *H01L 2227/323* (2013.01); *H01L 2251/5338* (2013.01)

(58) Field of Classification Search
CPC . H01L 51/0097; H01L 51/5253; H01L 51/56; H01L 27/3276; H01L 2227/323; H01L 2251/5338; G09G 3/035; G09G 3/3225; G09G 2380/02
See application file for complete search history.

(56) References Cited

U.S. PATENT DOCUMENTS

| 7,465,678 B2* | 12/2008 | Bhattacharya | H01L 51/0021 257/642 |
| 10,026,721 B2* | 7/2018 | Kim | H01L 25/0753 |
| 10,235,925 B2* | 3/2019 | Lee | G09G 3/3611 |
| 2004/0155244 A1* | 8/2004 | Kawata | H01L 29/66772 257/59 |
| 2004/0192082 A1* | 9/2004 | Wagner | H05K 1/11 439/67 |

(Continued)

FOREIGN PATENT DOCUMENTS

EP 2806475 A2 11/2014

OTHER PUBLICATIONS

Extended European Search Report in the European Application No. 20158773.0, dated Sep. 25, 2020, (8p).

*Primary Examiner* — Kenneth Bukowski
(74) *Attorney, Agent, or Firm* — Arch & Lake LLP

(57) ABSTRACT

The present disclosure relates to a display component, a display, manufacturing methods thereof and an electronic device. The display component comprises: a pixel array comprising a plurality of pixel units, two adjacent pixel units are connected by a connecting structure; and the connecting structure is configured to enable a distance between the pixel units to be increased or decreased to a required connection length when the pixel array is bent, and is further configured to transmit a driving signal for driving the pixel units to emit light.

13 Claims, 8 Drawing Sheets

(56) References Cited

U.S. PATENT DOCUMENTS

| | | |
|---|---|---|
| 2014/0346474 A1 | 11/2014 | Jeong et al. |
| 2015/0108439 A1* | 4/2015 | Kim .................... H01L 51/5237 |
| | | 257/40 |
| 2016/0055783 A1* | 2/2016 | Lee ...................... G09G 3/2003 |
| | | 345/690 |
| 2016/0087229 A1 | 3/2016 | Jeong et al. |
| 2016/0211471 A1* | 7/2016 | Kwon ................. H01L 51/5275 |
| 2017/0207412 A1 | 7/2017 | Jeong et al. |
| 2018/0046221 A1 | 2/2018 | Choi et al. |
| 2019/0198782 A1* | 6/2019 | Kim .................... H01L 51/5253 |
| 2019/0258297 A1 | 8/2019 | Choi et al. |
| 2020/0143729 A1* | 5/2020 | Xu ....................... G09G 3/2007 |

* cited by examiner

Frame

DISPLAY COMPONENT, DISPLAY, MANUFACTURING METHODS AND ELECTRONIC DEVICE

CROSS-REFERENCE TO RELATED APPLICATION

This application is based upon and claims priority to Chinese Patent Application 2019110429660 filed on Oct. 30, 2019, the entire contents of which are incorporated herein by reference.

TECHNICAL FIELD

The present disclosure relates to the technical field of display, in particular to a display component, a display, manufacturing methods and an electronic device.

BACKGROUND

In daily life, electronic devices with display functions are applied more and more widely. With the development of display technology, more and more research has been conducted on bendable electronic devices.

To make an electronic device bendable, as shown in FIG. 1, flat screens which have specific shapes are often spliced on different areas of bent surfaces of the electronic device by a screen splicing method. However, such method may form frames without a display function at the splicing seams between the adjacent flat screens, it degrades the display effect and user experience.

SUMMARY

The present disclosure provides a display component, a display, manufacturing methods thereof and an electronic device.

According to a first aspect of the present disclosure, a display component is provided. The display component includes a pixel array. The pixel array includes a plurality of pixel units, wherein two adjacent pixel units are connected by a connecting structure. The connecting structure is configured to enable a distance between the every two adjacent pixel units to be increased or decreased to a required connection length when the pixel array is bent, and is further configured to transmit a driving signal for driving the pixel units to emit light.

According to a second aspect of the present disclosure, a display is provided, including: a flat display area and a curved display area. A display component constituting the curved display area is the display component according to the first aspect of the embodiments of the present disclosure.

According to a third aspect of the present disclosure, a method of manufacturing a display component is provided. The method of manufacturing a display component is configured to manufacture the display component according to the first aspect of the embodiments of the present disclosure, and the method includes: forming a pixel array comprising a plurality of pixel units; and forming a connecting structure for connecting two adjacent pixel units; wherein the connecting structure is configured to enable a distance between the pixel units to be increased or decreased to a required connection length when the pixel array is bent, and is further configured to transmit a driving signal for driving the pixel units to emit light.

According to a fourth aspect of the present disclosure, a method of manufacturing a display is provided. The method of manufacturing the display is configured to manufacture the display according to the second aspect of the embodiments of the present disclosure, and the method includes: forming a pixel array comprising a plurality of pixel units; and forming a connecting line for connecting two adjacent pixel units, wherein the connecting line is configured to transmit a driving signal for driving the pixel units to emit light, the connecting line in the curved display area is a connecting structure configured to enable a distance between the pixel units to be increased or decreased to a required connection length when the pixel array is bent, and the connecting line in the flat display area is a straight line.

According to a fifth aspect of the present disclosure, an electronic device is provided, including a casing, a processing module, and the display according to the second aspect of the embodiments of the present disclosure.

The processing module may be located in the casing and configured to generate a driving signal.

The display may be configured to perform displaying according to the driving signal.

It is to be understood that the above general description and the following detailed description are merely exemplary and explanatory, and should not limit the present disclosure.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

Figure 1:
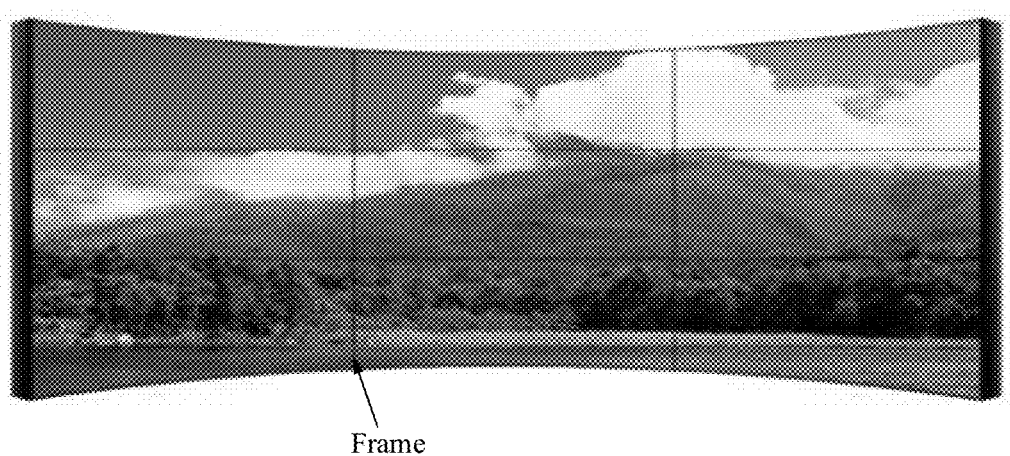
FIG. 1 is a schematic diagram illustrating a display screen in the prior art.

To make a bendable electronic device in FIG. 1, unbendable flat screens are often spliced on different areas of bent surfaces of the electronic device. However, this method may form frames without a display function at the splicing seams between adjacent flat screens, which may degrade the display effect and user experience. Until now, it has not yet appeared such a method that a bendable electronic device is manufactured by making a bent surface of the electronic device to be covered with a bendable flexible screen.

Figure 2A:
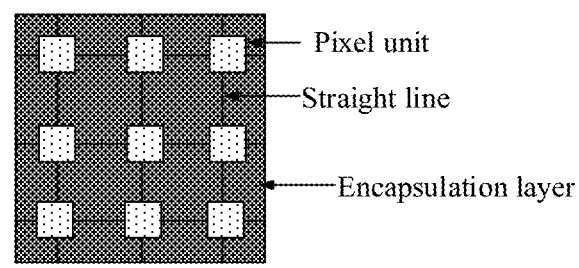
FIG. 2A is a partial schematic diagram of a display component without being stretched.
Figure 2B:
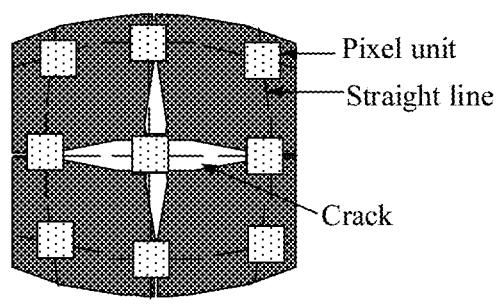
FIG. 2B illustrates a schematic diagram that is stretched in multiple directions when the display component in FIG. 2A.

FIG. 2A is a partial schematic diagram of a display component without being stretched, and FIG. 2B illustrates a schematic diagram that is stretched in multiple directions when the display component in FIG. 2A. Adjacent pixel units are connected by a connecting line, and the connecting line is configured to transmit a driving signal for driving the pixel units to emit light. In practical applications, to reduce the area of a Printed Circuit Board (PCB) occupied by the connecting line, the connecting line often is a straight line. Generally, the connecting line is not deformed, such as expanded or contracted, under the action of external force.

With reference to FIG. 2A and FIG. 2B, when the display component is subjected to acting forces from multiple directions, the display component may be deformed towards the multiple directions of the acting force, and the distance between the pixel units located in the deformation area may change.

When the display component is deformed in multiple directions, the distance between the pixel unit (for example, the pixel unit located at the center) and the adjacent pixel unit may increase. The connecting line between the pixel unit and the adjacent pixel unit may not deform, therefore, when the distance between the pixel unit and the adjacent pixel unit increases, the connecting line may be subjected to a stretching acting force. Furthermore, in a case that the stretching acting force is beyond the range that the connecting line can withstand, the connecting line may be caused to break, and the connecting line between the pixel unit located at the center and the adjacent pixel unit may break. The pixel unit located in the center cannot receive the driving signal, as a result, the pixel unit may fail.

Moreover, when the display component is deformed in multiple directions, the distances between eight pixel units surrounding the center pixel unit may also increase, and the connecting lines between the pixel units also may break. As a result, all the pixel units in the area may fail.

Figure 3:
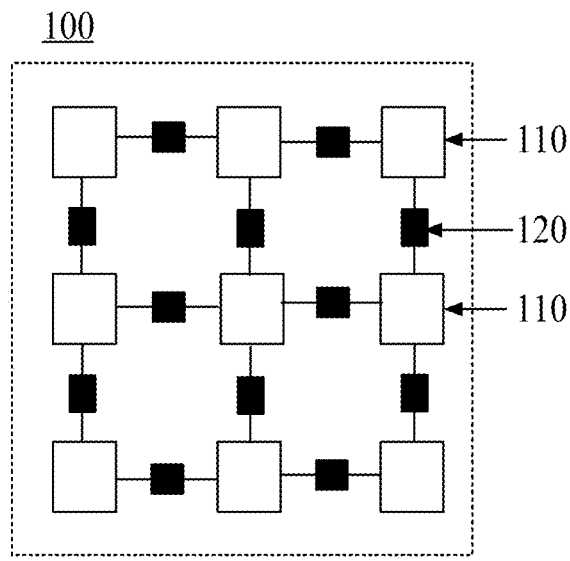
FIG. 3 is a partial schematic diagram illustrating another display component according to an example.

FIG. 3 is a schematic diagram illustrating a display component 100 according to an example. Referring to FIG. 3, the display component 100 includes: a pixel array comprising a plurality of pixel units 110. Two adjacent pixel units 110 are connected by a connecting structure 120. The connecting structure 120 is configured to enable a distance between the two adjacent pixel units 110 to be increased or decreased to a required connection length when the pixel array is bent, and is further configured to transmit a driving signal for driving the pixel units 110 to emit light.

The display component 100 could be any component having a display function, for example, a display screen of a mobile terminal, a display surface of a wearable device, and the like.

The pixel unit 110 could be a Light-Emitting Diode (LED) or an Organic Light-Emitting Diode (OLED), for example, a Micro-LED and an Active-Matrix Organic Light-Emitting Diode (AMOLED).

The connecting structure 120 may include a structure capable of being stretched, and is configured to provide a connection length required for an increased distance between the pixel units 110 when the pixel array is bent, or provide a connection length required for a decreased distance when the pixel array is bent. It can be understood that when the distance between adjacent pixel units 110 in the pixel array decreases, the connecting structure 120 may contract. A gap may exist between the different adjacent connecting structures 120, which may reduce the rate of display errors of the display component 100 caused by contact between the different connecting structures 120, thereby ensuring the user experience.

The constituent materials of the connecting structure 120 may include: conductive rubber, conductive metal, and the like.

In an example, the connecting structure 120 may include an elastic straight-line segment, or a curved connecting line. The curved connecting line may further include an elastic connecting line.

For example, the connecting structure 120 includes an elastic straight-line segment. In a case that the pixel array is bent and that the distance between two pixel units connected by the elastic straight-line segment needs to be increased, the elastic straight-line segment can be stretched to provide a connection length required for the increased distance between the adjacent pixel units 110. In such a case, the elastic straight-line segment may be stretched to become a curved-line segment.

In a case that the pixel array is bent and that the distance between two pixel units connected by the elastic straight-line segment needs to be decreased, the elastic straight-line segment can contract to a required connection length to allow the decrease of distance between the two pixel units connected by the elastic straight-line segment.

Figure 4A:
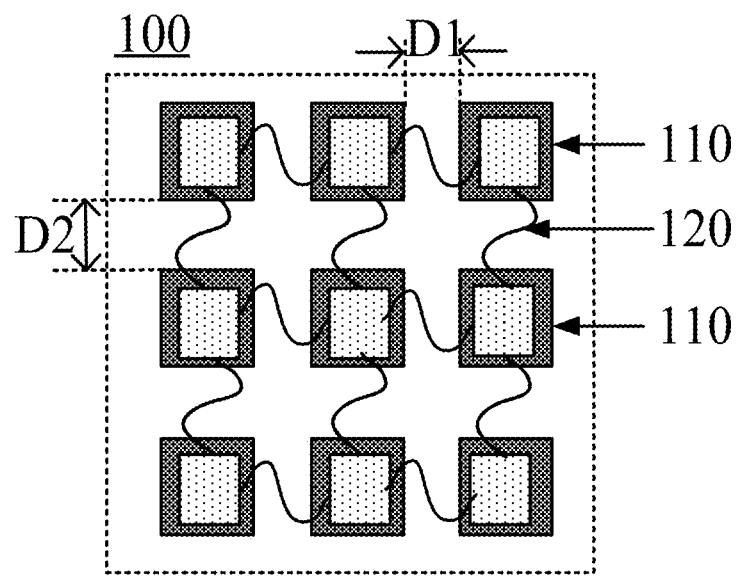
FIG. 4A is partial schematic diagrams illustrating a second display component according to an example.

For another example, the connecting structure 120 includes a curved connecting line. Referring to FIG. 4A, in a case that the display component 100 does not deform, the curved connecting line may be located at a gap between two adjacent pixel units 110.

Figure 4B:
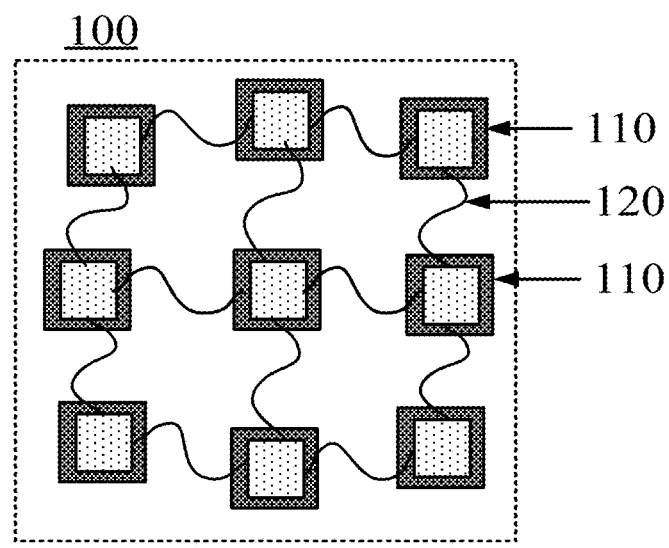
FIG. 4B is partial schematic diagrams illustrating a second display component according to an example.

Referring to FIG. 4B, it is assumed that when the display component 100 is deformed, the pixel unit 110 located at the center is the highest point of the curved surface formed after the deformation, and the rest eight pixel units 110 surrounding the pixel unit 110 at the center are arranged radially around. When the distance between two adjacent pixel units 110 increases, the curved connecting line connecting the adjacent two pixel units 110 may be stretched, and the shape of the curved connecting line may be caused to change. In such a case, the curved connecting line provides the connection length required to increase the distance between the adjacent pixel units, that is, the curved connecting line after the shape change can still connect the two adjacent pixel units 110, and still guarantee that the display component 100 can work normally. Here, the deformation of the display component 100 may include bending, stretching, and the like. It can be understood that when the shape of the curved connecting line changes, the length of the curved connecting line may not change.

In a case that the pixel units are bent and that the distance between the adjacent pixel units decreases, the curved connecting line may contract to a required connection length between the adjacent pixel units. In such a case, the curved connecting line may become a more curved connecting line. It can be understood that the length of the curved connecting line can be unchanged.

In practical applications, the change of the distance between two adjacent pixel units 110 can be calculated by simulation, according to the amount of deformation required by the display component 100. The length of the connecting structure 120 can be set according to the distance between two adjacent pixel units 110, or a material, which can have a deformation to an extent greater than the amount of change in the distance, may be selected to make the connecting structure 120.

In an example, when the display component 100 needs to achieve a stretch rate of 5%-10%, that is, when the area of the display component 100 where stretch occurs needs to be increased by 5%-10%, the change of the distance between two adjacent pixel units in the stretched area may be calculated by simulation. In such a case, the length of the curved connecting line for connecting the two adjacent pixel units may be greater than the sum of the distance between the adjacent two pixel units when stretching occurs and the amount of change in the distance when the stretching occurs.

In an example, the length of the curved connecting line may be a predetermined multiple of the distance between the two adjacent pixel units 110.

The distance between two adjacent pixel units 110 may be the distance between two adjacent pixel units 110 before the display component 100 is deformed. For example, the length of the curved connecting line may be twice the distance between two adjacent pixel units 110.

Referring to FIG. 4A, the length of a curved connecting line for connecting two horizontally arranged adjacent pixel units 110 may be twice the distance D1 between the horizontally arranged adjacent two pixel units. The length of a curved connecting line for connecting two vertically arranged adjacent pixel units may be twice the distance D2 between the two vertically arranged adjacent pixel units. The distance D1 may be same with the distance D2.

In practical applications, if the length of the curved connecting line is too long, the possibility of contact between the adjacent curved connecting lines may increase, and the cost of the display component 100 may increase. Therefore, by making a reasonable layout on the flexible substrate to form a curved connecting line with a predetermined multiple of the distance between two adjacent pixel units 110, it is possible to ensure that the display component 100 has flexibility, and at the same time, the probability of the display component 100 displaying errors due to contact between the different curved connecting lines can be reduced, and the user experience can be ensured.

Figure 5A:
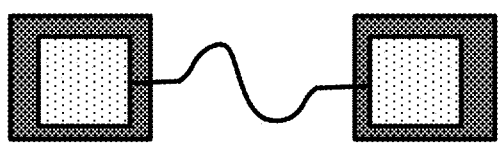
FIG. 5A is partial schematic diagrams illustrating a third display component according to an example.

Referring to FIG. 5A, the curved connecting line may be formed by sequentially connecting at least one S-shaped line segment.

Figure 5B:
FIG. 5B is partial schematic diagrams illustrating a third display component according to an example.

Or, referring to FIG. 5B, the curved connecting line may be a wavy line.

When the shape of the curved connecting line changes, the change may include that an S-shaped line segment is stretched to a curved line segment with a smaller bending radian or a straight line, or a wavy line is stretched to a curved line with a smaller distance between a crest and an adjacent trough.

The material of the curved connecting line may include metal or alloy having a certain ductility, for example, aluminum, copper, and the like.

In the embodiments of the present disclosure, two adjacent pixel units 110 may be connected by the curved connecting line. When the display component 100 is subjected to acting force in multiple directions and is deformed, the curved connecting line may change in shape to allow relative displacement between adjacent pixel units 110 in the pixel array, so that the display component 100 can deform in multiple directions. Compared with connecting two adjacent pixel units by a straight line, the technical solution provided by the embodiments of the present disclosure can reduce the probability of the connecting lines for connecting the pixel units being broken when the display component is deformed, and improve the flexibility of the display component.

In some embodiments, the display component 100 may further include a flexible substrate and encapsulation layers.

The flexible substrate may be configured to bear the pixel array. The pixel units 110 may be located between the flexible substrate and the encapsulation layers.

The encapsulation layers may be configured to protect the pixel units 110. Different pixel units 110 may have the encapsulation layers independent of each other.

The constituent materials of the flexible substrate may include: stainless steel sheets, polymer, and the like, for example, polyimide, Polyethylene glycol terephthalate (PET), Polycarbonate (PC), Polystyrene (PS), Polypropylene (PP), and the like. The use of the flexible substrate is beneficial to improve the flexibility of the display component 100 and reduce the probability of damage to the display component 100 when deformation occurs.

The encapsulation layer may include a single-layer thin film or a multilayer thin film structure. For example, in a case that the encapsulation layer has a multi-layer thin film structure, the encapsulation layer may be formed by a structure in which an organic thin film layer and an inorganic thin film layer are stacked by Thin Film Encapsulation (TFE). The inorganic thin film layer may be made of at least one of aluminum oxide ($Al_2O_3$), silicon dioxide ($SiO_2$), magnesium oxide (MgO), or magnesium fluoride ($MgF_2$). The organic thin film layer may be made of at least one of Tetrafluoroethylene (TFE), Polymethyl-Methacrylate (PMMA), polyimide, PET, PC, PS, or PP. It can be understood that the encapsulation layer formed by adopting the above materials needs to ensure the light transmittance of the pixel unit.

Since different pixel units have independent encapsulation layers, when the display component is deformed, the deformation of the encapsulation layers of the individually encapsulated pixel units can be less or no deformation may occur. Therefore, the force applied to the encapsulation layer when the display component is deformed may be reduced, and further the probability of the encapsulation layer being damaged may be reduced.

In an example, independent encapsulation of each pixel unit may increase the cost of the display component. In practical applications, in a case that the deformation extent of a first area of the display component is greater than that of a second area of the display component, a first number of adjacent pixel units may be encapsulated in the same encapsulation layer in the first area of the display component, and a second number of adjacent pixel units may be encapsulated in the same encapsulation layer in the second area of the display component. The first number may be less than the second number.

Simulation may be performed according to a first maximum deformation extent to be implemented in the first area and a second maximum deformation extent to be implemented in the second area, and the change of the distance between adjacent pixel units in the first area and the second area may be calculated respectively. Further, adjacent pixel units that the change of the distance is greater than a distance threshold may be encapsulated in different encapsulation layers, and adjacent pixel units that the change of the distance is less than the distance threshold may be encapsulated in the same encapsulation layer, thereby this method increase the minimum size of the encapsulation layer required to be etched and formed, and reduce the difficulty of process.

For example, each pixel unit is individually encapsulated in the first area, while in the second area, four adjacent pixel units that make up a square shape are encapsulated in the same encapsulation layer. That is, the first number may be one and the second number may be four.

Figure 6:
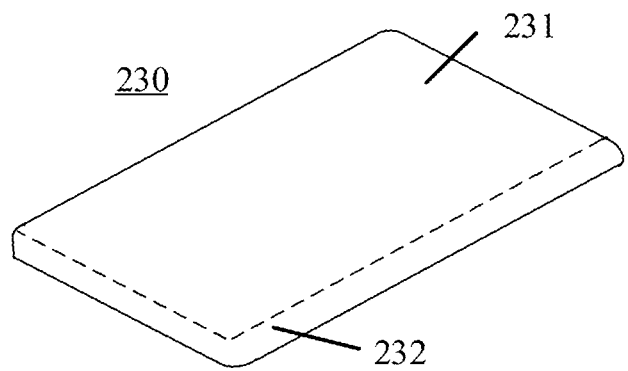
FIG. 6 is a partial schematic diagram illustrating a display according to an example.

FIG. 6 is a schematic diagram illustrating a display 230 provided by an example. Referring to FIG. 6, the display 230 includes a flat display area 231 and a curved display area 232. The display component forming the curved display area 232 is the display component 100 provided by the embodiments of the present disclosure.

The display 230 may include a display screen provided with both a flat display area 231 and a curved display area 232.

In practical applications, the flat display area and curved display area of the display may be set according to the application scenario of the display. For example, in a case that the display is applied to the surface of an electronic device, the flat display area may be configured to cover the flat area of the electronic device, and the curved display area may be configured to cover the cambered surface of the electronic device. The connecting line between adjacent pixel units in the flat display area 231 may be a straight line.

In a case that the distance between two adjacent pixel units is the same, the cost of manufacturing a straight connecting line may be lower than the cost of manufacturing a curved connecting line. Therefore, in the embodiments of the present disclosure, the cost of manufacturing the display can be reduced by setting the connecting lines between adjacent pixel units as curved connecting lines in the curved display area and keeping the connecting lines in the flat display area as straight lines.

In an example, the substrate of the curved display area 232 may be a flexible substrate, and the substrate of the flat display area 231 may be a hard substrate; or, the substrates of the flat display area 231 and the curved display area 232 may be both flexible substrates.

Figure 7:
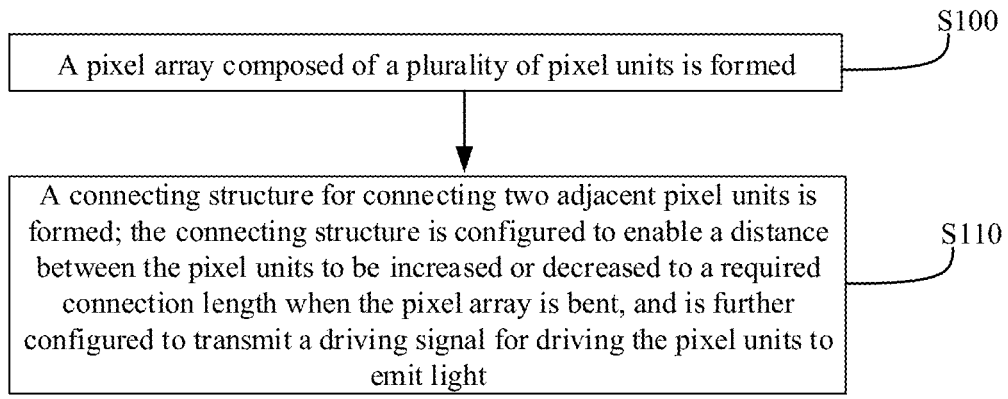
FIG. 7 is a flow chart illustrating a method of manufacturing a display component according to an example.

FIG. 7 is a schematic diagram illustrating a method of manufacturing a display component according to an example. The method of manufacturing the display component is configured to manufacture the display component 100 according to the embodiments of the present disclosure, and the method of manufacturing the display component includes:

S100, forming a pixel array comprising a plurality of pixel units.

S110, forming a connecting structure for connecting two adjacent pixel units; where the connecting structure is configured to enable a distance between the pixel units to be increased or decreased to a required connection length when the pixel array is bent, and the connecting structure is further configured to transmit a driving signal for driving the pixel units to emit light.

In the embodiments of the present disclosure, two adjacent pixel units may be connected by the connecting structure. When the display component is bent, the connecting structure may enable a distance between the pixel units to be increased or decreased to a required connection length to allow relative displacement between every adjacent two pixel units in the pixel array, so that the display component can be bent in multiple directions, the probability of the connecting line for connecting the pixel unit being broken when the display component is bent can be reduced, and the flexibility of the display component can be improved.

In some embodiments, the method of manufacturing the display component further includes:
forming a barrier layer that cover the pixel array and the connecting structure; and
etching the barrier layer according to a preset pattern to form encapsulation layers, where different pixel units are provided with the encapsulation layers independent of each other.

The material of the barrier layer is the same as that of the encapsulation layer. After the barrier layer is etched, independent encapsulation layers corresponding to different pixel units may be formed.

In practical applications, the extent of deformation occurring in different areas of the display component may be different. Therefore, the amount of change in the distance between adjacent pixel units in different areas of the display component may be calculated by simulation. Further, the preset pattern may be designed according to the simulation result, adjacent pixel units that the change of the distance is greater than a distance threshold may be encapsulated in different encapsulation layers, and adjacent pixel units that the change of the distance is less than the distance threshold may be encapsulated in the same encapsulation layer, thereby this method increase the minimum size of the encapsulation layer required to be etched and formed, and reduce the difficulty of process.

In some embodiments, S100 may include: forming the pixel array that comprises a plurality of organic light-emitting diodes.

Comparing with a pixel array formed by Light-Emitting Diodes (LED), a pixel array formed by Organic Light-Emitting Diodes (OLED) can be thinner, have better curvature, and be more flexible.

Figure 8:
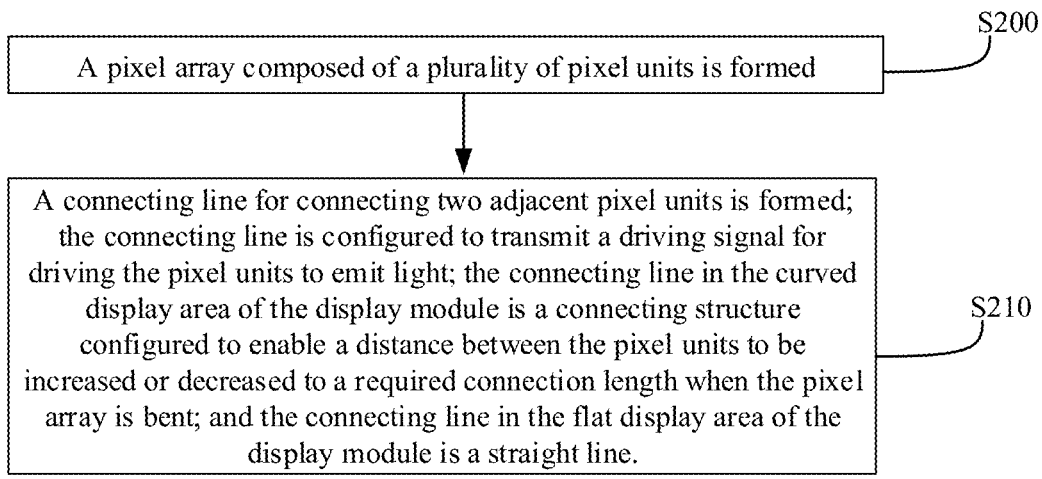
FIG. 8 is a flow chart illustrating a method of manufacturing a display according to an example.

FIG. 8 shows a method of manufacturing a display according to an example. The method of manufacturing the display is configured to manufacture the display provided by the embodiments of the present disclosure. Referring to FIG. 8, the method of manufacturing the display includes:

S200, forming a pixel array comprising a plurality of pixel units.

S210, forming a connecting line for connecting two adjacent pixel units. Wherein the connecting line is configured to transmit a driving signal for driving the pixel units to emit light; the connecting line in the curved display area is a connecting structure configured to enable a distance between the pixel units to be increased or decreased to a required connection length when the pixel array is bent; and the connecting line in the flat display area is a straight line.

In the embodiments of the present disclosure, the cost of manufacturing the display can be reduced by setting the connecting lines between adjacent pixel units as curved connecting lines in the curved display area and keeping the connecting lines in the flat display area as straight lines.

In some embodiments, the method of manufacturing the display further includes:
forming a barrier layer that cover the pixel array, the straight line and the connecting structure; and
etching the barrier layer according to a preset pattern to form a uniform encapsulation layer of the flat display area, wherein independent encapsulation layers of the pixel units are formed in the curved display area.

In an example, in the process of etching the barrier layer, two light shields with different preset patterns may be used to separately etch a portion of the barrier layer covering the flat display area and a portion of the barrier layer covering the curved display area.

Or, in the process of etching the barrier layer, the barrier layer may be etched by using the same light shield with different preset patterns in different areas, and the same encapsulation layer of the flat display area and the independent encapsulation layer of each pixel unit in the curved display area may be formed. In this way, process steps may be reduced and production efficiency may be improved.

Figure 9:
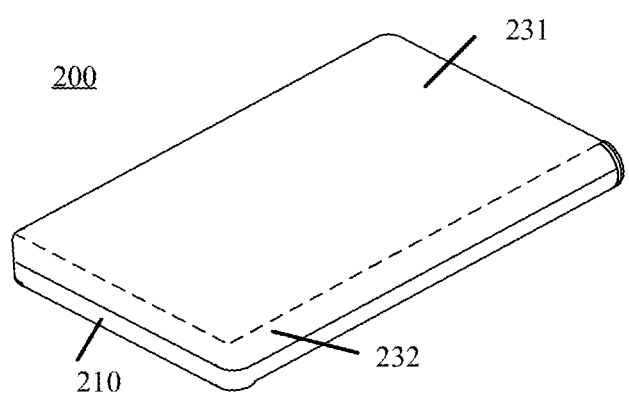
FIG. 9 is a schematic diagram illustrating an electronic device according to an example.

FIG. 9 is a schematic diagram illustrating an electronic device 200 according to an example. Referring to FIG. 9, the electronic device 200 includes: a casing 210, a processing module (not shown) and the display 230 provided by the embodiments of the present disclosure.

The processing module may be located in the casing 210 and may be configured to generate a driving signal.

The display 230 may be configured to perform displaying according to the driving signal.

The electronic device 200 may include a fixed terminal and a mobile terminal, for example, a desktop computer, a television, a mobile phone, a wearable device, a tablet computer, and the like.

The processing module is generally configured to control overall operations of the electronic device 200, such as operations associated with display, telephone calls, data communication and camera operation. The processing module may include one or more processors to execute instructions to generate the driving signals. In addition, the processing module may further include one or more modules to facilitate interaction between the processing module and other components. For example, the processing module may include a multimedia module to facilitate interaction between multimedia components.

In an example, the flat display area 231 may include a display area located on a first surface the electronic device 200. The curved display area 232 may include: a display area located on a second surface of the electronic device 200. The second surface may be an adjacent surface of the first surface and the second surface may be a cambered surface.

The flat display area 231 and the curved display area 232 of the display may be in contact with each other for performing display together based on driving signals. The connecting line between two adjacent pixel units in the flat display area 231 of the display may be a straight line.

With the development of electronic device technology, users' demand for the ratio of a screen to a device has gradually increased. To increase the screen ratio, electronic device manufacturers often set up pop-up cameras or under-screen cameras to address the screen defects such as "fringes" and "beauty tips" on the display panels of electronic devices.

However, even if the camera does not occupy the position of the display panel, since the electronic device has multiple surfaces, there is a corner between adjacent surfaces, for example, a rounded corner between a display panel and a side frame of a casing of a mobile phone. In the full-screen technology, the display area of a cambered area covering the electronic device casing can be stretched.

In a case that the display provided in the related art is stretched, since the connecting line between the pixel units is a straight line, the display can be stretched in one direction only, and cannot be stretched in multiple directions at the same time. In a case that the display in the related art is stretched in multiple directions at the same time, the connecting line between adjacent pixel units in the display or the encapsulation of the display may be damaged, causing the display to fail. That is, the display in the related art cannot cover a cambered surface like a spherical surface, and cannot realize full-screen display.

Compared with the related art, the electronic device 200 provided in the embodiments of the present disclosure uses the display component 100 as the curved display area 232 required to be stretched in the display 230, so that the curved display area 232 of the display 230 can be stretched in multiple directions at the same time, which lays a foundation for the realization of the full-screen display technology.

The cost of manufacturing the display component 100 is higher than that of the flat display area 231, therefore, in the embodiments of the present disclosure, the display component 100 is only used as the curved display area 232 needed to be stretched. The display component 100 has higher compatibility than the prior art, and on the basis of increasing the coverage area of the display area and achieving a full-screen display effect, the display component 100 can reduce the cost of manufacturing the electronic device 200.

Other embodiments of the present disclosure will be apparent to those skilled in the art from consideration of the specification and practice of the invention disclosed here. The present disclosure is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. A display, comprising:
   a flat display area and a curved display area;
   wherein a display component constituting the curved display area comprises a pixel array comprising a plurality of pixel units, wherein every two adjacent pixel units are connected by a connecting line that is an elastic straight line; and the connecting line is a connecting structure configured to enable a distance between the every two adjacent pixel units to be increased or decreased to a required connection length when the pixel array is bent and is further configured to transmit a driving signal for driving the pixel units to emit light,
   wherein every two adjacent pixel units in the flat display area are connected by a straight line,
   wherein the display further comprises encapsulation layers configured to protect the pixel units, and
   wherein simulation is performed according to a first maximum deformation extent of a first area of the display component and a second maximum deformation extent of a second area of the display component a change of a distance between adjacent pixel units in the first area and a change of a distance between adjacent pixel units in the second area are calculated; and adjacent pixel units with the change of the distance greater than a distance threshold are encapsulated in different encapsulation layers, and adjacent pixel units with the change of the distance less than the distance threshold are encapsulated in a same encapsulation layer.

2. The display of claim 1, wherein
a substrate of the curved display area is a flexible substrate, and a substrate of the flat display area is a hard substrate; or,
substrates of the flat display area and the curved display area are both flexible substrates.

3. The display of claim 1, wherein the connecting structure is a curved connecting line.

4. The display of claim 3, wherein
the curved connecting line comprises one or more sequentially connected S-shaped line segments; or,
the curved connecting line is a wavy line.

5. The display of claim 3, wherein a length of the curved connecting line is a predetermined multiple of the distance between the every two adjacent pixel units.

6. The display of claim 1, further comprising a flexible substrate;
wherein the flexible substrate is configured to bear the pixel array, and the pixel units are located between the flexible substrate and the encapsulation layers.

7. A method of manufacturing a display comprising a flat display area and a curved display area, comprising:
forming a pixel array comprising a plurality of pixel units;
forming independent encapsulation layers of the plurality of pixel units in the curved display area; and
forming a connecting line for connecting every two adjacent pixel units;
wherein the connecting line is configured to transmit a driving signal for driving the pixel units to emit light; the connecting line in the curved display area is a connecting structure configured to enable the distance between the every two pixel units to be increased or decreased to a required connection length when the pixel array is bent; the connecting line in the curved display area is an elastic straight line and the connecting line in the flat display area is a straight line,
wherein forming independent encapsulation layers of the plurality of pixel units in the curved display area comprises:
performing simulation according to a first maximum deformation extent of a first area of the display component and a second maximum deformation extent of a second area of the display component;
calculating a change of a distance between adjacent pixel units in the first area and a change of a distance between adjacent pixel units in the second area; and
encapsulating adjacent pixel units with the change of the distance greater than a distance threshold in different encapsulation layers, and encapsulating adjacent pixel units with the change of the distance less than the distance threshold in a same encapsulation layer.

8. The method of claim 7, further comprising:
forming a barrier layer that cover the pixel array, the straight line and the connecting structure; and
etching the barrier layer according to a preset pattern to form a uniform encapsulation layer of the flat display area.

9. The method of claim 7, further comprising:
forming a flexible substrate for the curved display area, and forming a hard substrate for the flat display area; or,
forming flexible substrates for both the flat display area and the curved display area.

10. An electronic device, comprising a casing, a processing module, and a display; wherein the display comprising:
a flat display area and a curved display area;
wherein a display component constituting the curved display area comprises:
a pixel array comprising a plurality of pixel units,
wherein every two adjacent pixel units are connected by a connecting line that is an elastic straight line; and the connecting line is a connecting structure configured to enable a distance between the every two adjacent pixel units to be increased or decreased to a required connection length when the pixel array is bent, and is further configured to transmit a driving signal for driving the pixel units to emit light, wherein every two adjacent pixel units in the flat display area are connected by a straight line;
wherein the processing module is located in the casing and is configured to generate a driving signal; and
the display is configured to perform displaying according to the driving signal,
wherein the display further comprises encapsulation layers configured to protect the pixel units, and
wherein simulation is performed according to a first maximum deformation extent of a first area of the display component and a second maximum deformation extent of a second area of the display component a change of a distance between adjacent pixel units in the first area and a change of a distance between adjacent pixel units in the second area are calculated; and adjacent pixel units with the change of the distance greater than a distance threshold are encapsulated in different encapsulation layers, and adjacent pixel units with the change of the distance less than the distance threshold are encapsulated in a same encapsulation layer.

11. The electronic device of claim 10, wherein
the flat display area of the display comprises a display area located on a first surface of the electronic device; and
the curved display area of the display comprises a display area located on a second surface of the electronic device, wherein the second surface is an adjacent surface of the first surface and the second surface is a cambered surface.

12. The electronic device of claim 10, wherein
a substrate of the curved display area is a flexible substrate, and a substrate of the flat display area is a hard substrate; or,
substrates of the flat display area and the curved display area are both flexible substrates.

13. The electronic device of claim 12, wherein
the flexible substrate is configured to bear the pixel array, wherein the pixel units are located between the flexible substrate and the encapsulation layers.

* * * * *